United States Patent [19]
Okumura et al.

[11] Patent Number: 5,153,689
[45] Date of Patent: Oct. 6, 1992

[54] SEMICONDUCTOR MEMORY DEVICE HAVING BIT LINES FORMED OF AN INTERCONNECTING LAYER OF LOWER REFLECTANCE MATERIAL THAN THE MATERIAL OF THE WORD LINES

[75] Inventors: Yoshinori Okumura; Takayuki Matsukawa; Ikuo Ogoh; Masao Nagatomo; Hideki Genjo; Atsushi Hachisuka, all of Hyogo, Japan

[73] Assignee: Mitsubishi Denki Kabushiki Kaisha, Tokyo, Japan

[21] Appl. No.: 404,528

[22] Filed: Sep. 8, 1989

[30] Foreign Application Priority Data

Sep. 14, 1988 [JP] Japan .................. 63-230817

[51] Int. Cl.[5] .............................. H01L 29/78
[52] U.S. Cl. .................. 357/23.6; 357/23.4
[58] Field of Search .............. 357/23.6, 23.4

[56] References Cited

U.S. PATENT DOCUMENTS 4,754,313 6/1988 Takemae et al. ............ 357/41
4,810,619 3/1989 Pampalone et al. ......... 430/313

FOREIGN PATENT DOCUMENTS 3428565 3/1985 Fed. Rep. of Germany .
3435750 4/1986 Fed. Rep. of Germany .
60-2784 12/1982 Japan .
59-154027 2/1983 Japan .
59-148361 2/1984 Japan .
2145243 3/1985 United Kingdom .

OTHER PUBLICATIONS

Sze, Semiconductor Devices, 1985, pp. 376-377.
M. Koyanagi et al., "Novel High Density, Stacked Capacitor MOS RAM" IEDM 1978, pp. 348-351.
IEEE Journal of Solid-State Circuits, vol. SL-15, No. 4, Aug. 1980, by Koyamagi et al., pp. 661-666, "A 5-V Only 16-kbit Stacked-Capacitor MOS RAM".
IEEE Journal of Solid-State Circuits, vol. SC-20, No. 5, Oct. 1985, by Saito et al., pp. 903-908, "A I-Mbit CMOS DRAM with Fast Page Mode and Static Column Mode".
Electronics, Aug. 25, 1982, by W. C. Benzing, pp. 116-119 "Shrinking VLSI dimensions demand new interconnection materials".
IBM Technical Disclosure Bulletin, vol. 22, No. 12, No. 12, May 1980, pp. 5466-5467 "Improved Conductivity Polysilicon Lines for MOSFET and Bipolar Technology" by B. L. Crowder and S. Zirinsky.

Primary Examiner—Andrew J. James
Assistant Examiner—Stephen D. Meier
Attorney, Agent, or Firm—Lowe, Price, Le Blanc & Becker

[57] ABSTRACT

A memory cell of a semiconductor memory device comprises one MOS transistor (3) and one stacked capacitor (4). One of the source/drain regions (8a, 8b) of the MOS transistor is connected to a bit line (2a, 2b). The bit line is formed from a contact portion to the source/drain regions of the MOS transistor to a portion above the stacked capacitor. The bit line is formed of a metal having high melting point, a silicide of a metal having high melting point or a polycide. Since this material has low reflectance against exposing light, the precision in patterning the interconnection is improved.

7 Claims, 3 Drawing Sheets

SEMICONDUCTOR MEMORY DEVICE HAVING BIT LINES FORMED OF AN INTERCONNECTING LAYER OF LOWER REFLECTANCE MATERIAL THAN THE MATERIAL OF THE WORD LINES

BACKGROUND OF THE INVENTION

1. Field of the Invention

The present invention relates to a semiconductor memory device and, more specifically, to an improvement in an interconnecting structure of a semiconductor memory device having stacked capacitor in each memory cell.

2. Description of the Background Art

In most types of dynamic semiconductor memory devices (hereinafter referred to as DRAMs), each memory cell comprises one transfer gate transistor and one capacitor. Devices of such types are suitable for higher degree of integration, since the number of elements constituting a memory cell is small. DRAMs having stacked capacitors in which capacitors are stacked in three dimensions have been proposed so as to further improve the degree of integration. One example of such DRAMs is disclosed in Japanese Patent Publication No. 2784/1985. The structure of the memory cell in the stacked type DRAM will be described with reference to FIGS. 4 and 5.

FIG. 4 is a plan view of the memory cell and FIG. 5 shows a cross sectional structure thereof viewed from the direction along the line V—V of FIG. 4.

Referring to these figures, a plurality of word lines 1a, 1b, 1c and 1d are formed in a row direction and a plurality of bit lines 2a and 2b are formed in the column direction of a memory cell array in the DRAM. The bit lines 2a and 2b which are adjacent to each other constitute a pair of bit lines. The bit line pair is connected to a sense amplifier. One transfer gate transistor 3 and one capacitor 4 are formed near each of the intersections between the word lines and the bit lines. The transfer gate transistor 3 comprises a gate electrode 1c (formed of a portion of the word line 1c) formed on a surface of a semiconductor substrate 5 with a gate oxide film 6 interposed therebetween. Portions around the gate electrode 1c are covered with an insulating film 7. Impurity regions 8a and 8b are formed on the surface region of the semiconductor substrate 5 in self-alignment with the gate electrode 1c. The impurity regions 8a and 8b will be the source/drain regions of the transistor. A lower electrode 9 of the capacitor 4 is formed on the surface of the impurity region 8b. The lower electrode 9 extends from above the gate electrode 1c toward a portion above the word line 1b running on the field oxide film 18, with insulating films 7 and 7a interposed respectively therebetween. A dielectric film 10 having a two-layer structure including a silicon nitride film and an oxide film is formed on the surface of the lower electrode 9. An upper electrode 11 of the capacitor 4 is formed thereon. The lower electrode 9, the dielectric film 10 and the upper electrode 11 constitute a capacitor 4. An interlayer insulating film 12 formed of a silicon oxide film or the like is formed on the capacitor 4. The bit line 2b formed of aluminum (Al) is deposited by sputtering on the surface of the interlayer insulating film 12. The bit line 2b is connected to one impurity region 8b of the transfer gate transistor 3 through a contact hole 13.

As described above, in the stacked type DRAM, the capacitor 4 has a structure stacked in three dimension, and accordingly the device is thick in the direction of stacking compared with, for example, a planar type DRAM. For example, the bit line 2b is formed in a region 3000 to 6000 Å higher from the surface of the semiconductor substrate. Therefore, interconnections such as the bit line 2b, which are formed at relatively high portions from the surface of the semiconductor substrate, are generally formed on regions having various ups and downs. Therefore, patterning of the interconnecting layer is difficult, as will be described with reference to FIG. 6. FIG. 6 is a schematic cross sectional view showing the step of patterning of the bit line 2b formed on the surface of the interlayer insulating film 12, in which the longitudinal direction of the bit line 2b corresponds to the direction vertical to the sheet. A contact hole 13 is formed in the interlayer insulating film 12. An aluminum layer 2b is deposited on the surface thereof by sputtering. A resist 14 is applied on the surface thereof. A mask 15 for forming patterns aligned with the semiconductor substrate is arranged above the resist 14 with a space provided therebetween. The mask 15 for patterning has a region 17 for intercepting exposure light. Portions of the resist region 14b and the aluminum layer 2b which are covered with the light intercepting region 17 are the regions constituting the desired bit line 2b. The exposing light 16 emitted from an exposing apparatus reaches the resist 14 through the mask 15 for patterning. The prescribed regions 14a of the resist 14 is exposed by the light. However, the exposing light passed through the resist 14 is reflected by the aluminum layer 2b as it highly reflects the exposing light 16. In addition, there are many ups and downs in the bit line 2b formed on the upper layer, as it is influenced by the shapes of the capacitor 4 and the transistor 3 formed therebelow. Consequently, part of the exposing light 16 is irregularly reflected to enter and expose a region 14b of the resist 14 which should not be exposed. As a result, the pattern formed on the resist 14 becomes narrower than the prescribed pattern widths. When the bit line 2b is etched by using said resist pattern as a mask, the resulting bit line 2b may be thin and may possibly be cut in some cases.

FIG. 7 is a schematic plan view of the bit line 2b whose width is narrower than the prescribed width. Such a bit line 2b narrower than the prescribed width may possibly be cut by electromigration, and the wiring resistance may possibly be increased.

SUMMARY OF THE INVENTION

An object of the present invention is to improve reliability of bit lines in a semiconductor memory device having a stacked capacitor.

Another object of the present invention is to provide a material of bit lines suitable for miniaturizing interconnecting layers.

A semiconductor memory device in accordance with the present invention comprises an insulated gate field effect element and a semiconductor capacitor formed on a semiconductor substrate.

The insulated gate field effect element comprises a first conductive layer constituting a first interconnecting layer formed on a portion of a semiconductor region of a first conductivity type which portion surrounded by an oxide film for isolation between devices, with a first insulating film interposed therebetween, and impurity regions of a second conductivity type formed in the semiconductor region sandwiching the first conductive layer. The semiconductor capacitor comprises a second conductive layer extending above the first conductive layer to an upper portion of the oxide film for isolation, having one portion connected to one of the impurity regions of the second conductivity type, a dielectric film formed thereon, and a third conductive layer formed further thereon. A second interconnecting layer is further provided extending in a direction orthogonal to the first interconnecting layer above the semiconductor capacitor with a first interlayer insulating film interposed therebetween. The second interconnecting layer is formed of a material selected from the group consisting of metal having high melting point, silicide of metal having high melting point and polycide.

The reflectance of the material of the interconnecting layers in the present invention against the exposing light employed in the step of photolithography is not so high as that of aluminum, for example, which was popularly used in the prior art. Accordingly, the exposing light passed through the resist can be prevented from being reflected and scattered in the step of photolithography for patterning interconnections. Therefore, the precision in exposing the patterns of the resist can be improved. Consequently, the wirings in the multilayer interconnecting layers such as bit lines can be well shaped, which are patterned using resist patterns having high precision as mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be hereinafter described with reference to the figures.

Figure 1:
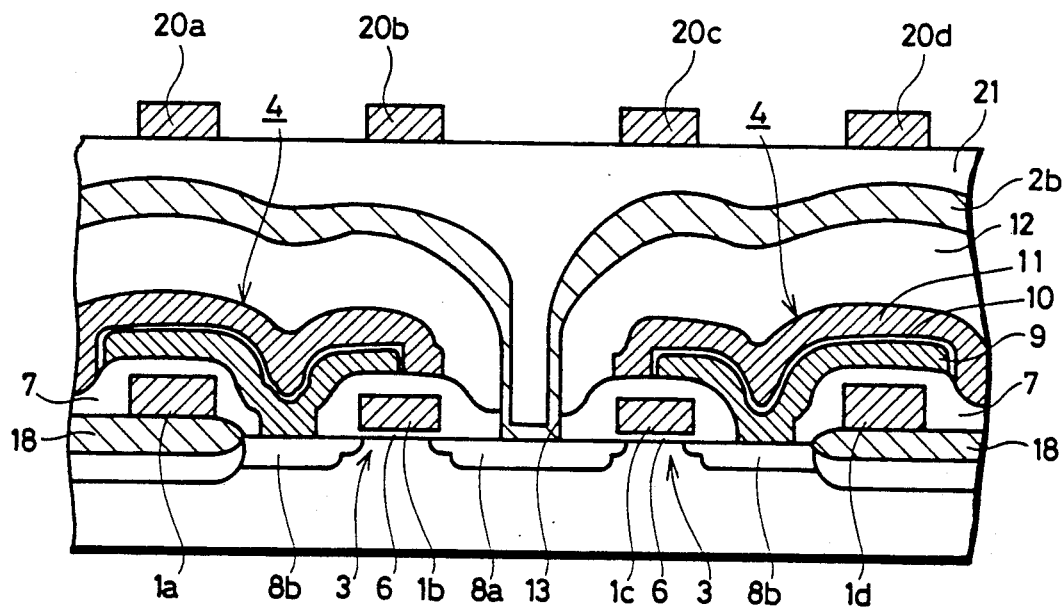
FIG. 1 is a cross sectional view of a memory cell of a DRAM in accordance with one embodiment of the present invention.
Figure 2:
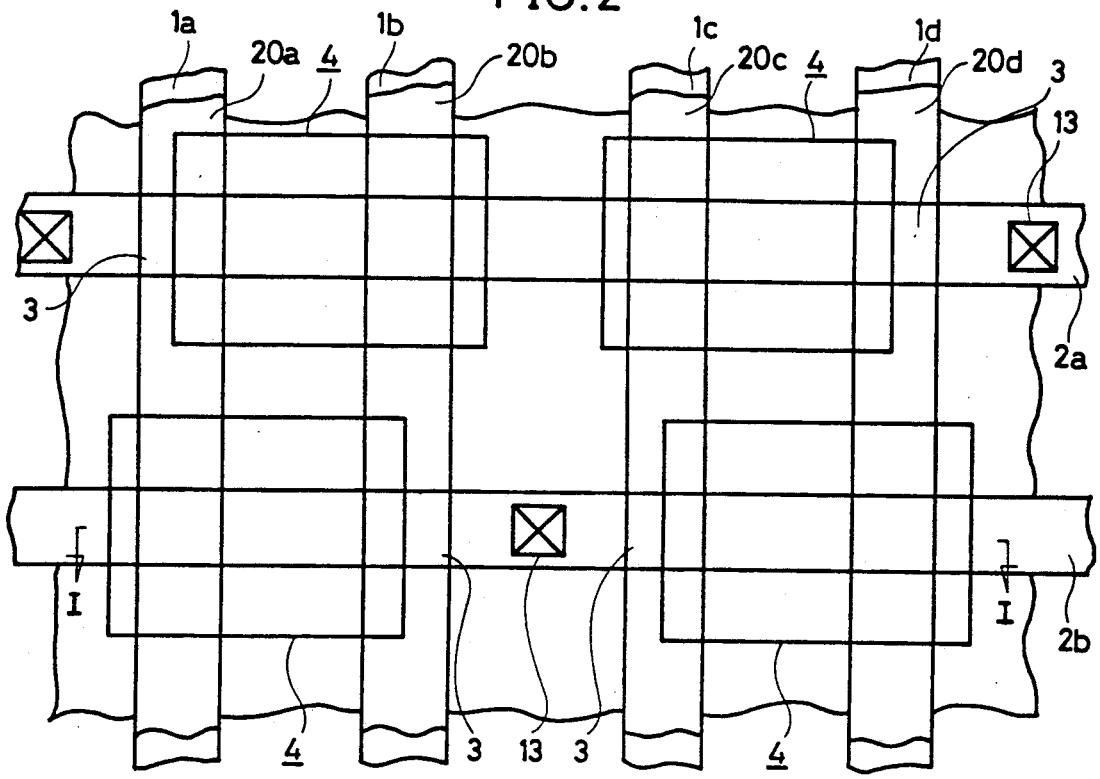
FIG. 2 is a plan view of the memory cell of the DRAM having the cross sectional structure shown in FIG. 1.

A structure of a memory cell array of a DRAM in accordance with a one embodiment of the present invention is shown in FIGS. 1 and 2. Referring to these figures, the memory cell array comprises a plurality of word lines 1a, 1b, 1c and 1d extending in the row direction and a plurality of bit lines 2a and 2b extending in the column direction orthogonal to the row direction. Second word lines (hereinafter referred to as auxiliary word lines) 20a, 20b, 20c and 20d are provided superimposed above the word lines 1a to 1d. A memory cell is formed near each of the intersections between the word lines 1a to 1d and the bit lines 2a and 2b. Each memory cell comprises one transfer gate transistor 3 and one capacitor 4. The transfer gate transistor 3 comprises a gate electrode formed on a surface of a p type semiconductor substrate 5 with a gate oxide film 6 interposed therebetween. The gate electrode constitutes a portion of the word lines 1a to 1d. An insulating film 7 covers the surroundings of the gate electrode. Impurity regions 8a and 8b are formed in self-alignment with the gate electrode on the surface region of the p type semiconductor substrate 5. The impurity regions 8a and 8b serve as the source/drain regions which has a so-called LDD (Light Doped Drain) structure having impurity layers of lower concentration provided on the side surfaces of the impurity region of higher concentration near the channel. The capacitor 4 comprises a stacked structure including a lower electrode 9, a dielectric film 10 and an upper electrode 11. The lower electrode 9 is formed of polysilicon with impurity introduced thereto, which extends above a gate electrode 1b (1c) of the transfer gate transistor 3 to the upper portion of the word line 1a (1d) running above the field oxide film 18 with an insulating film 7 interposed therebetween. A portion of the lower electrode 9 is connected to the impurity region 8b. The dielectric film 10 is formed on the lower electrode 9 and comprises a two-layer structure of a silicon nitride film and an oxide film formed on the surface thereof. The upper electrode 11 is formed of a polysilicon with impurities introduced thereto. Such a stacked type capacitor 4 formed overlaid on the gate electrode of the transfer gate transistor 3 and on the field oxide film 18 contributes to reduce planar area of occupation on the substrate surface, and increases the degree of integration while it maintains large capacity. Therefore, compared with a planar type capacitor, the layer formed on the substrate surface is thicker. The upper surfaces of the capacitor 4 and the like are covered with a first interlayer insulating film 12 which is formed of a silicon oxide film or a BPSG (Boro-Phospho Silicate Glass) film. The bit line 2b is formed on the surface of the first interlayer insulating film 12. The bit line 2b is connected to the impurity region 8a of the transfer gate transistor 3 through a contact hole 13 formed in the first interlayer insulating film 12. The bit line 2b is formed of materials such as metals having high melting points such as molybdenum (Mo), tungsten (W) titanium (Ti) and tantalum (Ta), silicide of these metals having high melting points, or polycide having stacked structure including polysilicon and silicide of these metals having high melting points.

Figure 6:
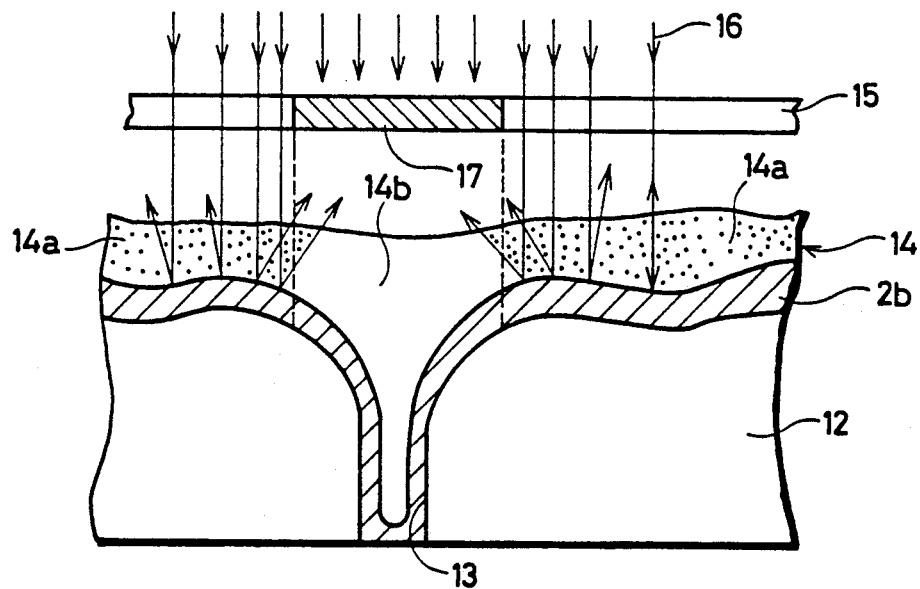
FIG. 6 is a cross sectional view showing a process of manufacturing the bit line of the conventional DRAM.
Figure 7:
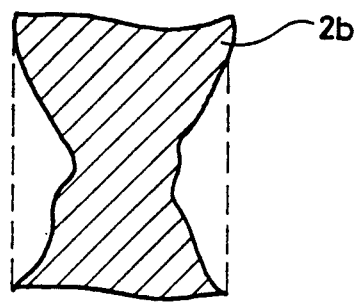
FIG. 7 is a schematic plan view showing a planar shape of the bit line manufactured through the process shown in FIG. 6.

The characteristic of the above mentioned materials of the bit line, which is the characteristic of the present invention, will be described in the following. The reflectance against the exposing light employed in the step of lithography of this material of the bit line is relatively low compared with that of aluminum used in the prior art. For example, if the exposing light has the wavelength of 435 nm, 85% thereof is reflected by aluminum, while only 40 to 50% thereof is reflected by tungsten or molybdenum. In addition, the surfaces of the interconnecting layers formed of these metals having high melting points are more smooth compared with the interconnecting layers formed of aluminum. By making use of these characteristics, irregular reflection of the exposing light can be prevented to improve precision in exposing resist in the step of photolithography shown in FIG. 6. The improvement in precision of exposing the resist patterns enables further improvement in the patterning precision of the interconnecting layer. As a result, when the interconnecting layers are formed of these metals having high melting points, disconnection or reduction in size of the wirings during manufacturing process can be prevented, improving reliability of the interconnecting layer. In addition, the widths of the wiring can be made smaller, compared with the conventional interconnecting layers formed of aluminum, thereby miniaturizing the structure and improving degree of integration. The reduction of width of the bit line 2b means reduction of the bit line capacitance. The reduction of the bit line capacitance increase current of the output signal to the sense amplifier in reading stored data, thereby improving sensitivity of the sense amplifier.

The wirings are formed by the above mentioned material respectively in the following methods. First, in case of a metal having high melting point, it is deposited on an interlayer insulating film 12 by sputtering. In case of a silicide of a metal having high melting point, a polysilicon is deposited on the interlayer insulating film 12 by CVD (Chemical Vapor Deposition) method, and the metal having high melting point is deposited on the surface thereof by sputtering. Thereafter, thermal processing is carried out so as to turn the metal having high melting point into silicide. In case of a polycide, polysilicon is deposited on the interlayer insulating film 12 by the CVD method, and the metal having high melting point is deposited on the surface thereof by sputtering or CVD method to provide a stacked structure.

A second interlayer insulating film 21 is formed on the surface of the bit line 2 formed in the above described manner. Auxiliary word lines 20a, 20b, 20c and 20d are formed further thereon. The auxiliary word lines 20a to 20d are formed overlapped with the word lines 1a to 1d below in the same direction, and they are in contact with the word lines 1a to 1d at several portions in the longitudinal direction. The auxiliary word lines serve to reduce rise time of the word line by applying voltage immediately to the word lines 1a to 1d through the contact portions. Therefore, the auxiliary word lines 20a to 20d must be formed of materials having superior conductivity and low resistance such as aluminum.

Figure 3:
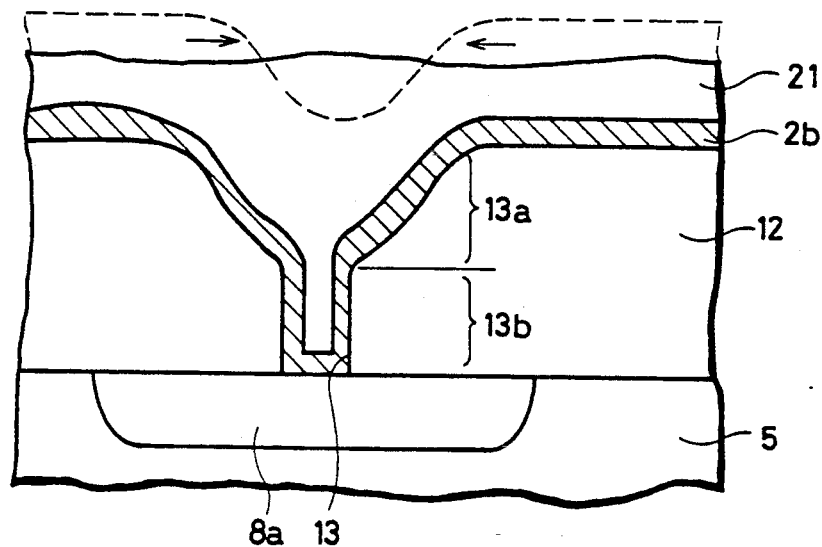
FIG. 3 is a schematic cross sectional view for illustrating processes for manufacturing the structure near the bit line 2b shown in FIG. 1.
Figure 4:
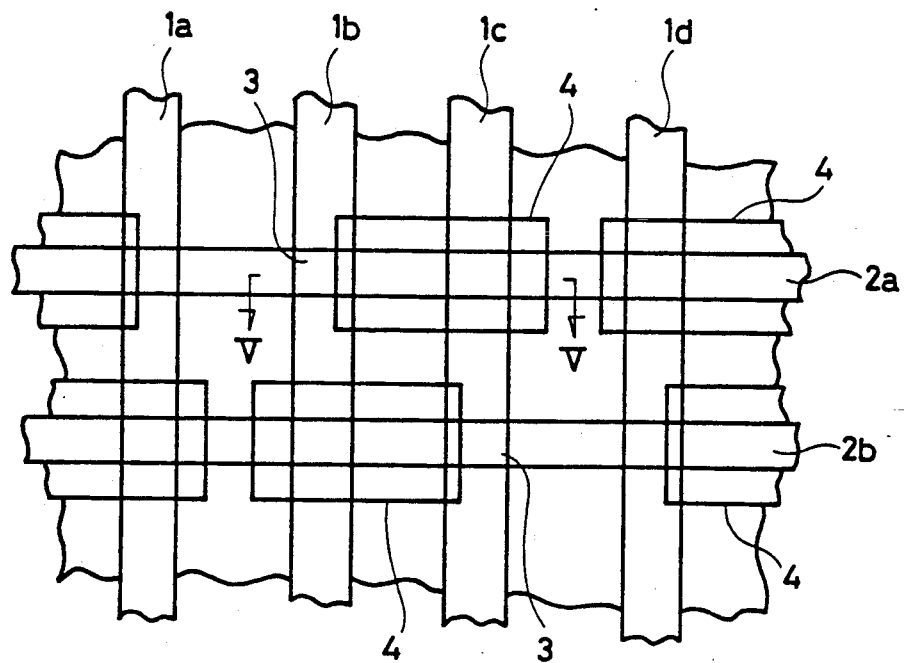
FIG. 4 is a plan view of a conventional memory cell of a DRAM.
Figure 5:
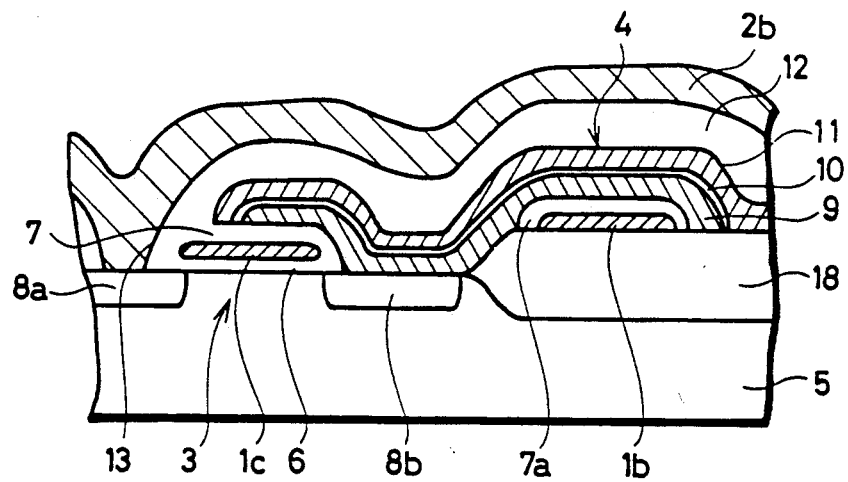
FIG. 5 is a cross section taken along the line V—V of FIG. 4.

When the bit lines 2b are formed by materials such as metal having high melting points as described above, the following effect is also provided, which will be described with reference to FIG. 3. As the degree of integration has been higher and higher, the device structure of the memory cell in the DRAM has been miniaturized. Accordingly, the opening area of the contact hole 13 providing contact between the bit line 2b and the impurity region 8a formed on the surface of the semiconductor substrate has been reduced. As it becomes difficult to deposit materials of wirings in the contact hole 13 reduced in size, the contact hole 13 is formed in the first interlayer insulating film 12 such that the upper portion of the hole becomes larger than the bottom portion thereof. The opening portion 13a flaring upward is formed by isotropic etching such as wet etching of the surface region of the first interlayer insulating film 12. Thereafter, the contact hole portion 13b having the prescribed width of opening is formed by anisotropic etching such as reactive ion etching. By doing so, the bit line 2b can be readily deposited with a reduced area of contact to the impurity region 8a. Thereafter, the second interlayer insulating film 21 is deposited on the surface of the bit line 2b. The surface of the second interlayer insulating film 21 is undulated, influenced by the shape of the contact hole 13a with large area of opening. In order to make smooth the surface, the BPSG film constituting the second interlayer insulating film 21 is reflown at a high temperature of 850° to 950° C. The step of reflow at such high temperature could not be sufficiently carried out on the conventional bit lines formed of aluminum, as the bit lines may be melt. Therefore, in the prior art, the surface of the second interlayer insulating film had various ups and downs. On the contrary, in the present invention, the surface of the second interlayer insulating film can be made smooth, whereby the auxiliary word line can be easily formed, with high precision, on the surface.

As described above, the present invention provides the following effects by forming bit lines in a memory cell array of a DRAM with materials of metals having high melting points and the like.

(a) Manufacturing reliability of the bit line can be improved and precision of dimension of the interconnections can be improved.

(b) The current of the output signals representing the stored information can be increased as the bit line capacitance is reduced.

(c) The step of making flat the surface of the interlayer insulating film formed on the bit line can be sufficiently carried out.

Although materials such as metals having high melting points are used for the bit line of the memory cell array in a DRAM in the above embodiment, such materials may be used for the auxiliary word lines and so on formed further on the upper layer.

Although the multilayer interconnections of a memory cell of a stacked type DRAM have been described, the application of the present invention is not limited thereto, and it can be widely applied to other multilayer interconnections of other devices.

As described above, according to the present invention, interconnecting layers formed at relatively upper layers of a semiconductor memory device comprising a so-called stacked type capacitor are formed of materials such as metals having high melting points with low reflectance, the precision in patterning the interconnecting layer can be improved, thereby improving reliability of the interconnecting layer, and a semiconductor memory device which is highly reliable and highly integrated can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a semiconductor substrate (5) of a first conductivity type having a major surface and an oxide film (18) for isolation, a MOS transistor (3) having a pair of impurity regions (8a, 8b) of a second conductivity type formed in said major surface of said semiconductor substrate at a prescribed distance from each other, a first insulating film (6) formed on said major surface of said semiconductor substrate, and a first conductive layer (1b, 1c) constituting a first interconnecting layer formed on said first insulating film between said pair of impurity regions;

a capacitor (4) having a second conductive layer (9) extending above said first conductive layer to an upper portion of said oxide film for isolating, one portion of which is connected to one of said impurity regions of the second conductivity type, a dielectric film (10) formed on said second conductive layer, and a third conductive layer (11) formed on said dielectric film;

a second interconnecting layer (2a, 2b) formed of a material having a lower reflectance than aluminum and selected from the group consisting of a metal having high melting point, a silicide of a metal having high melting point and a polycide, whereby reflection of light used in making the memory device is reduced thereby improving precision in making the device, said second interconnecting layer positioned in a direction orthogonal to said first conductive layer above said capacitor with a first interlayer insulating film interposed therebetween; and a third interconnecting layer (20a, 20b, 20c, 20d) formed above said second interconnecting layer in alignment with said first conductive layer to be electrically connected to said first conductive layer, wherein said first interconnecting layer comprises word lines for said memory device and said third interconnecting layer comprises auxiliary word lines for said device, said third interconnecting layer being formed of a high conductivity material comprising aluminum for reducing a rise time of voltage applied therethrough to said word lines, and wherein said second interconnecting layer (2a, 2b) comprises bit lines for said memory device, whereby said memory device includes bit lines formed of a material having a lower reflectance than aluminum.

2. A semiconductor memory device, comprising:

a semiconductor substrate (5) of a first conductivity type having a major surface and an oxide film (18) for isolation, a MOS transistor (3) having a pair of impurity regions (8a, 8b) of a second conductivity type formed in said major surface of said semiconductor substrate at a prescribed distance from each other, a first insulating film (6) formed on said major surface of said semiconductor substrate, and a first conductive layer (1b, 1c) constituting a first interconnecting layer formed on said first insulating film between said pair of impurity regions;

a capacitor (4) having a second conductive layer (9) extending above said first conductive layer to an upper portion of said oxide film for isolating, one portion of which is connected to one of said impurity regions of the second conductivity type, a dielectric film (10) formed on said second conductive layer, and a third conductive layer (11) formed on said dielectric film;

a second interconnecting layer (2a, 2b) formed of a material having a lower reflectance than aluminum and selected from the group consisting of a metal having high melting point, a silicide of a metal having high melting point and a polycide, whereby reflection of light used in making the memory device is reduced thereby improving precision in making the device, said second interconnecting layer positioned in a direction orthogonal to said first conductive layer above said capacitor with a first interlayer insulating film interposed therebetween; and a third interconnecting layer (20a, 20b, 20c, 20d) formed above said second interconnecting layer in alignment with said first conductive layer to be electrically connected to said first conductive layer.

3. A semiconductor memory device according to claim 2, wherein said third interconnecting layer (20a, 20b, 20c, 20d) is formed of aluminum.

4. A semiconductor memory device according to claim 2, wherein said third interconnecting layer (20a, 20b, 20c, 20d) is formed of a material selected from the group consisting of a metal having high melting point, a silicide of a metal having high melting point and a polycide.

5. A semiconductor memory device according to claim 2 wherein said second interconnecting layer is formed of a silicide of metal having a high melting point.

6. A semiconductor memory device according to claim 2 wherein said first interconnecting layer comprises word lines for said memory device and said third interconnecting layer comprises auxiliary word lines for said device, said third interconnecting layer being formed of a high conductivity material for reducing a rise time of voltage applied therethrough to said word lines.

7. A semiconductor memory device according to claim 6 wherein said high conductivity material comprises aluminum.

* * * * *